(12) United States Patent
Griesbaum et al.

(10) Patent No.: US 10,749,563 B1
(45) Date of Patent: Aug. 18, 2020

(54) ANALOG INPUT MODULE

(71) Applicant: Siemens Aktiengesellschaft, Munich (DE)

(72) Inventors: Wilhelm Griesbaum, Landau (DE); Ulrich Lehmann, Wörth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/791,037

(22) Filed: Feb. 14, 2020

(30) Foreign Application Priority Data

Feb. 15, 2019 (EP) ..................... 19157518

(51) Int. Cl.
| | | |
|---|---|---|
| *H04B 1/40* | (2015.01) | |
| *H03K 19/177* | (2020.01) | |
| *G01D 7/00* | (2006.01) | |
| *H03M 1/38* | (2006.01) | |
| *H03M 3/00* | (2006.01) | |

(52) U.S. Cl.
CPC ............ *H04B 1/40* (2013.01); *H03K 19/177* (2013.01); *G01D 7/00* (2013.01); *H03M 1/38* (2013.01); *H03M 3/458* (2013.01)

(58) Field of Classification Search
None
See application file for complete search history.

(56) References Cited

U.S. PATENT DOCUMENTS

| | | | | |
|---|---|---|---|---|
| 7,218,265 B2* | 5/2007 | Roh | ....................... | H03M 1/181 |
| | | | | 341/155 |
| 7,495,591 B2* | 2/2009 | Moll | ..................... | G01R 31/316 |
| | | | | 341/120 |
| 9,318,955 B2* | 4/2016 | Shimizu | ................. | H02M 3/157 |
| 9,769,408 B2* | 9/2017 | Kim | ...................... | H04N 5/3575 |
| 2005/0190081 A1 | 9/2005 | Banks et al. | | |
| 2017/0227614 A1 | 8/2017 | Scherr | | |
| 2018/0164363 A1* | 6/2018 | Brorein | .................. | G01R 31/50 |

FOREIGN PATENT DOCUMENTS

| | | |
|---|---|---|
| DE | 102004009612 | 9/2005 |
| DE | 102013111888 | 4/2015 |
| DE | 102015102581 | 8/2015 |
| EP | 2090945 | 8/2009 |

OTHER PUBLICATIONS

EP Search report based on EP19157518 dated Aug. 2, 2019.

\* cited by examiner

*Primary Examiner* — Minh D A
*Assistant Examiner* — James H Cho
(74) *Attorney, Agent, or Firm* — Cozen O'Connor (57) ABSTRACT

A module for a programmable controller includes a plurality of analog input channels, a control and evaluation device, and input terminals, where for each input channel, the module includes two analog to digital converters, at least four coupling elements and a switchover device, where for each input channel, where an input side of one analog to digital converter is directly or indirectly connected with the input terminals and an output side is connected with the evaluation circuit via a coupling element, where a control input of the switchover device is connected with the switching signal generator via a further coupling element, a signal output of the switchover device is connected with an input side of the other analog-to-digital converter, and where an output side of the other analog-to-digital converter is connected with the evaluation circuit via a further coupling element, where the coupling elements cause electrical isolation.

16 Claims, 8 Drawing Sheets

ANALOG INPUT MODULE

BACKGROUND OF THE INVENTION

1. Field of the Invention

The present invention relates to a module of a programmable controller, where the module has a plurality of analog input channels each for an analog input signal, and where the module has a control and evaluation device and for each input channel, in each case independently of the other input channels, input terminals for supplying the respective analog input signal.

2. Description of the Related Art

Analog inputs modules are generally known. As a rule, they have a central analog-to-digital converter, which is connected in sequential succession via an analog multiplexer to the input terminals of the input channels. This leads to considerable hardware complexity, in particular because of the possible differences in potential of up to 120 V DC or 150 V AC between the various input terminals. Certification according to an Safety Integrity Level (SIL) level defined in International Electrotechnical Commission (IEC) 61508 is difficult.

DE 10 2004 009 612 A1 discloses a circuit arrangement for delay adjustment of time-offset analog-to-digital converters.

DE 10 2013 111 888 A1 discloses a safety device for multichannel processing of an analog input signal.

DE 10 2015 102 581 A1 describes a diagnostic method for monolithic sensor systems.

EP 2 090 945 A1 discloses an input group and an associated method for error detection.

SUMMARY OF THE INVENTION

It is an object of the present invention to provide a module of a programmable controller that simply and reliably allows certification in accordance with an SIL level defined in IEC 61508.

This and other objects and advantages are achieved in accordance with the invention by a module that has, for each input channel, in each case independently of the other input channels, a first and a second analog-to-digital converter, a first, a second, a third and a fourth coupling element and a switchover device, where the control and evaluation device for each input channel, in each case independently of the other input channels, includes an evaluation circuit, a test signal generator and a switching signal generator. An input side of the respective first analog-to-digital converter is connected directly or indirectly with the respective input terminals and an output side of the respective first analog-to-digital converter is connected via the respective first coupling element with the respective evaluation circuit. The respective switchover device has a first and a second signal input, where a signal output and a control input, where the first signal input of the respective switchover device is connected directly or indirectly with the respective input terminals, the second signal input of the respective switchover device is connected via the respective third coupling element with the respective test signal generator, the control input of the respective switchover device is connected via the respective fourth coupling element with the respective switching signal generator and the signal output of the respective switchover device is connected with an input side of the respective second analog-to-digital converter. In addition, an output side of the respective second analog-to-digital converter is connected via the respective second coupling element with the respective evaluation circuit and the respective first, the respective second, the respective third and the respective fourth coupling element are each formed as a coupling element which brings about electrical isolation.

Preferably, the control and evaluation device is arranged in a Field Programmable Gate Array (FPGA). In this way, the control and evaluation device can be produced inexpensively.

The control and evaluation device preferably has a respective receiver for the respective input channel, which receiver is connected with an output side of the respective first or the respective second coupling element and filters a respective frequency-encoded receive signal from a digital signal transmitted via the respective first or the respective second coupling element. This makes it simply possible to produce a "HART" receiver.

It is preferably also provided that the control and evaluation device has a respective transmitter for the respective input channel, the respective transmitter is connected via a respective fifth coupling element with the respective input terminals, the respective transmitter feeds a respective frequency-encoded transmit signal into the respective input signal and the respective fifth coupling element is embodied as a coupling element which brings about electrical isolation. This makes it simply possible to produce a "HART" transmitter.

Preferably the module includes a first power supply device, which supplies the control and evaluation device with electrical energy, the first power supply device is connected via a sixth coupling element with a second power supply device, the second power supply device supplies the first and second analog-to-digital converters of at least one of the input channels with electrical energy and the sixth coupling element is formed as a coupling element which brings about electrical isolation. In this way, electrically isolated power supply of the individual elements of the respective input channel is simply possible.

Preferably, the respective evaluation circuit includes a respective first and a respective second filter device for determining a respective first and a respective second filtered signal based on a respective digital signal output by the respective first and the respective second analog-to-digital converter, includes a respective first comparator for comparing the respective first and the respective second filtered signal and includes a respective second comparator for comparing a respective test signal output by the respective test signal generator and the respective second filtered signal.

This enables both simple and reliable mutual monitoring as early as within the control and evaluation device of the digital signals output via the two respective analog-to-digital converters, and additionally also checking of the analog-to-digital converters.

A digital signal output by the respective first and the respective second analog-to-digital converter is generally within a respective predetermined range of values. Preferably, the respective test signal generator is configured such that a respective test signal output by the respective test signal generator runs cyclically through the respective full predetermined range of values. In this way, the second analog-to-digital converter may also be tested over its full range of values.

It is possible for the respective test signal generator and the respective switching signal generator to be tuned to one another such that the respective test signal is initially fed via the respective second signal input of the respective switchover device directly or indirectly to the respective second analog-to-digital converter, the respective test signal then runs through the respective full predetermined range of values and only thereafter is the respective analog input signal again fed directly or indirectly to the respective second analog-to-digital converter. In this case, the second analog-to-digital converter is fully checked on each individual test phase.

Alternatively, it is possible for the respective test signal generator and the respective switching signal generator to be tuned to one another such that:
a) the respective test signal is initially fed via the respective second signal input of the respective switchover device directly or indirectly to the respective second analog-to-digital converter,
b) the respective test signal then runs through each part of the respective full predetermined range of values,
c) thereafter the respective analog input signal is again fed directly or indirectly to the respective second analog-to-digital converter and
d) steps a) to c) are performed repeatedly and when step b) is respectively performed the respective test signal runs through each different part of the respective full predetermined range of values, until the respective test signal has, as a result of repeating step b), run through the respective full predetermined range of values.

In this case, a plurality of test phases corresponding to step b) is required for complete checking of the second analog-to-digital converter, but the individual test phases may consequently be selected to be shorter.

Preferably, the respective first analog-to-digital converter is formed as a delta-sigma modulator and the respective first coupling element has, in addition to a forward channel for transmitting a respective digital signal output by the respective first analog-to-digital converter, a backward channel for transmitting a respective clock signal from the respective evaluation circuit to the respective first analog-to-digital converter. This constitutes a simple, reliable, inexpensive and robust embodiment for the respective first analog-to-digital converter. Alternatively or in addition, a corresponding embodiment may also be provided for the respective second analog-to-digital converter and the associated respective second coupling element.

The respective first and the respective second analog-to-digital converters are preferably diversely formed. In this way, systematic errors can be particularly reliably avoided.

To achieve a diverse embodiment, it is possible, based on the respective first and the respective second analog-to-digital converter, for one of these two analog-to-digital converters to be formed as a delta-sigma modulator and the coupling element connected with this analog-to-digital converter to have not only a forward channel for transmitting a digital signal output by this analog-to-digital converter but also a backward channel for transmitting a clock signal from the respective evaluation circuit to this analog-to-digital converter. Alternatively or in addition, it is possible, to achieve a diverse embodiment, for the other one of these two analog-to-digital converters to be formed as a Successive Approximation Register (SAR) analog-to-digital converter and the coupling element connected with this analog-to-digital converter to have not only a forward channel for transmitting a digital signal output by this analog-to-digital converter but also three backward channels for transmitting a clock signal, a configuration signal and a data frame signal from the respective evaluation circuit to this analog-to-digital converter.

Provided the one embodiment is selected for the one analog-to-digital converter and the other embodiment is selected for the other analog-to-digital converter, the diverse embodiment is produced wholly automatically. Provided the one or the other embodiment is selected just for the one or just for the other analog-to-digital converter respectively, the respective analog-to-digital converter respectively still to be formed in a diverse manner can be formed in any other desired way.

The respective first, the respective second, the respective third and the respective fourth coupling elements are preferably formed as inductive couplers. This embodiment is robust, inexpensive and reliable.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The above-described characteristics, features and advantages of this invention and the manner in which these are achieved will become clearer and more distinctly comprehensible from the following description of the exemplary embodiments, which are explained in greater detail with reference to the drawings, in which.

DETAILED DESCRIPTION OF THE EXEMPLARY EMBODIMENTS

Figure 1:
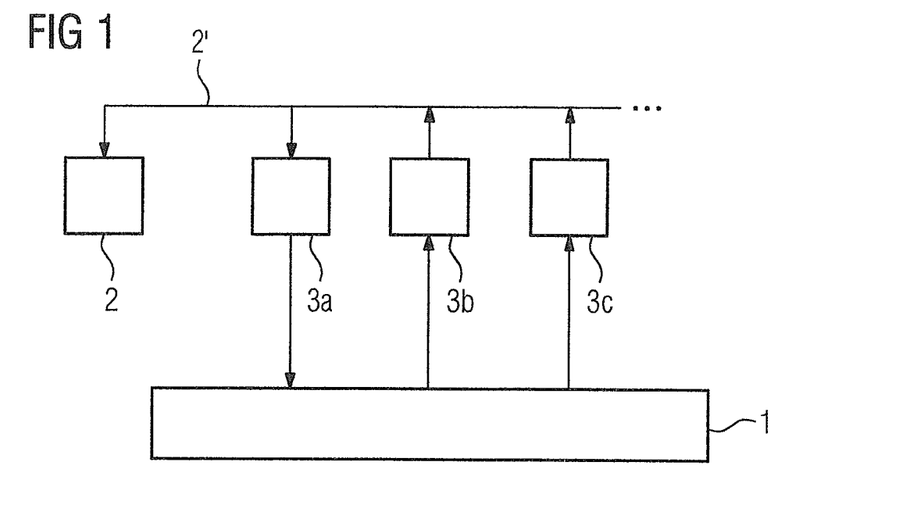
FIG. 1 shows a schematic representation of a technical industrial process and a programmable controller in accordance with the invention.

With reference to FIG. 1, a technical industrial process 1 is controlled by a programmable controller. The technical industrial process 1 may be of any desired nature. It may, for example, be a chemical plant, a filling apparatus, an injection molding machine, a conveying apparatus and another apparatus or plant. The programmable controller comprises a central processing unit 2 and peripheral modules 3a, 3b etc. The central processing unit 2 and the peripheral modules 3a, 3b etc. are connected together via a bus system 2'. The peripheral modules 3a, 3b etc. may be differently configured. For example, the peripheral module 3a may be a module via which digital control signals are output to the technical industrial process 1. Likewise, the peripheral module 3b may be a module via which digital process signals are fed to the programmable controller. At least one of the peripheral modules 3a, 3b etc. (in the present case the peripheral module 3c) is a module via which the analog process signals are fed to the programmable controller. The peripheral module 3c constitutes the subject matter of the present invention.

Figure 2:
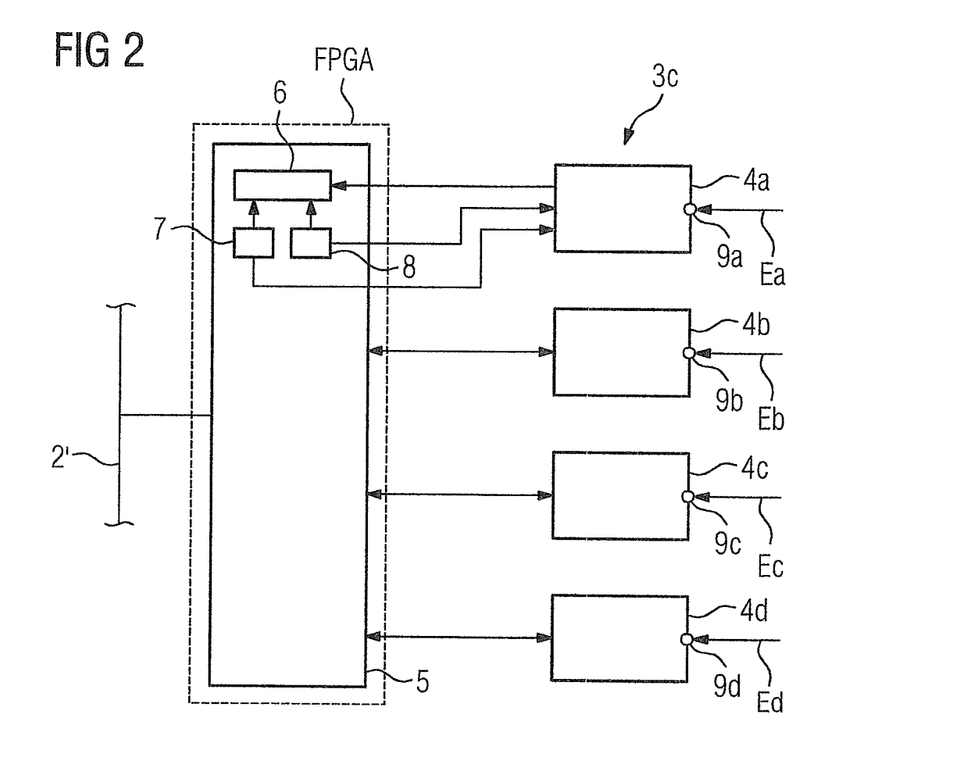
FIG. 2 shows schematic representation of a module of a programmable controller in accordance with the invention.

With reference to FIG. 2, the module 3c has a plurality of analog input channels 4a to 4d. As a rule, according to the representation in FIG. 2 at least four input channels 4a to 4d are present. The number of input channels 4a to 4d may, however, also be greater than four. They may, for example, amount to eight or 16. Often the number of input channels 4a to 4d is a power of two. With each of the input channels 4a to 4d, an analog input signal Ea to Ed may in each case be fed to the module 3c. The respective analog input signal Ea to Ed may denote any desired physical variable, such as a temperature, a pressure or a filling level.

The module 3c has a control and evaluation device 5. The control and evaluation device 5 is present once in the form of one unit for all input channels 4a to 4d. The control and evaluation device 5 has for each input channel 4a to 4d (in each case independently of the other input channels 4a to 4d) an evaluation circuit 6, a test signal generator 7 and a switching signal generator 8. The evaluation circuit 6, the test signal generator 7 and the switching signal generator 8 are thus independently and individually present for each individual input channel 4a to 4d. FIG. 2 shows the evaluation circuit 6, the test signal generator 7 and the switching signal generator 8 for input channel 4a alone.

The control and evaluation device 5 may be arranged, according to the representation in FIG. 2, for example, in an FPGA. The term "FPGA" (field programmable gate array) is generally familiar to skilled persons and refers to an electronic unit in which the hardware interconnection of the individual elements of the FPGA may be fixed by appropriate programming.

According to the representation in FIG. 2, the module 3c additionally has input terminals 9a to 9d for each input channel 4a to 4d, in each case independently of the other input channels 4a to 4d. The respective analog input signal Ea to Ed may be fed to the respective input channel 4a to 4d via the input terminals 9a to 9d. Furthermore, according to the representation in FIG. 3, the module 3c has for each input channel 4a to 4d (in each case independently of the other input channels 4a to 4d) a first and a second analog-to-digital converter 10, 11, a first, a second, a third and a fourth coupling element 12 to 15 and a switchover device 16. This is shown in FIG. 3 just for the input channel 4a.

The structure and mode of operation of input channel 4a alone are explained below in relation to FIG. 3 and also the further FIGs. Interaction with the control and evaluation device 5 is also explained just for the input channel 4a. The corresponding explanations also apply, however, mutatis mutandis for the other input channels 4b to 4d.

The analog input signal Ea may be a voltage signal. As a rule, however, it is a current signal. Here, the current signal generally lies in the range from 4 to 20 mA. This is of secondary significance, however. It could also lie in another range, for example in the range from −24 mA to +24 mA.

Figure 3:
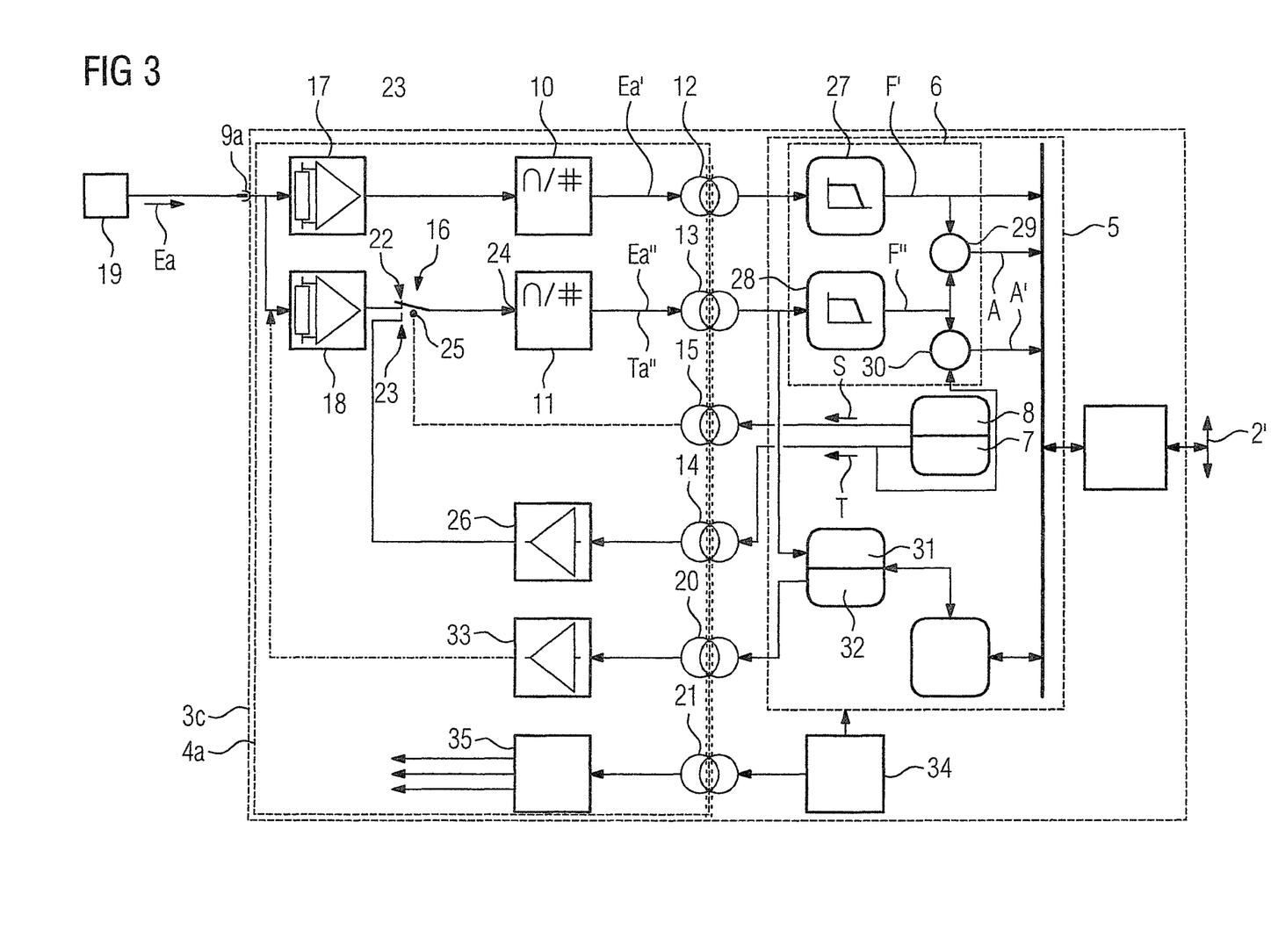
FIG. 3 is a more detailed representation of the module of FIG. 2.

According to the representation in FIG. 3, an input side of the first analog-to-digital converter 10 is directly or indirectly connected with the input terminals 9a. A direct connection is generally present if the analog input signal Ea is a voltage signal. If the analog input signal Ea, in contrast, is a current signal, then a current-to-voltage converter 17 is arranged between the input terminals 9a and the first analog-to-digital converter 10. For purposes of the present invention, the wording "directly or indirectly" should be understood as follows. An indirect connection is present if the respective signal is guided via a current-to-voltage converter 17, 18. If the respective signal is not guided via a current-to-voltage converter 17, 18, a direct connection is present.

An output side of the first analog-to-digital converter 10 is connected with the evaluation circuit 6 via the first coupling element 12. The analog input signal Ea generated via a sensor 19 is thereby digitized (optionally after current-to-voltage conversion) in the first analog-to-digital converter 10. The associated digital signal Ea' is fed to the evaluation circuit 6 via the first coupling element 12.

The first coupling element 12 is formed such that it brings about or causes electrical isolation. The first coupling element 12 may, for example, be formed as an optocoupler. Preferably, however, the first coupling element 12 is formed as an inductive coupler. Examples of suitable inductive couplers (sometimes also known as magnetic couplers) are generally known to skilled persons. Solely by way of example, reference may be made to the inductive couplers type ADuM1201 and type ADuM1412 from Analog Devices. Inductive couplers have the advantage, in particular, that they allow a high transmission speed (bit rate) and high insulation voltages (often above 2 kV). The second to fourth coupling elements 13 to 15 (and also a subsequently introduced fifth coupling element 20 and a subsequently introduced sixth coupling element 21) have identical forms.

With reference to FIG. 3, an input side of the second analog-digital converter 11 is furthermore likewise connected with the input terminals 9a. The switchover device 16 is, however, arranged between the input terminals 9a and the second analog-to-digital converter 11. The switchover device 16 in turn has a first signal input 22, a second signal input 23, a signal output 24 and a control input 25.

The first signal input 22 is directly or indirectly connected with the input terminals 9a. A direct connection is generally present if the analog input signal Ea is a voltage signal. If the analog input signal Ea is a current signal, then a direct connection may likewise be present. Here, the optionally necessary current-to-voltage converter 18 may be arranged between the switchover device 16 and the second analog-to-digital converter 11. Alternatively, an indirect connection may be present, namely when, according to the representation in FIG. 3, the current-to-voltage converter 18 is arranged between the input terminals 9a and the switchover device 16.

The signal output 25 of the switchover device 16 is connected with an input side of the second analog-digital converter 11. As with the connection of the first signal input 22 with the input terminals 9a, the connection may alternatively be direct or, if the current-to-voltage converter 18 is arranged between the switchover device 16 and the second analog-to-digital converter 11, indirect.

An output side of the second analog-to-digital converter 11 is connected with the evaluation circuit 6 via the second coupling element 13. Provided that, within the switchover device 16, the first signal input 22 is connected with the signal output 24, the analog input signal Ea generated via the sensor 19 is thereby digitized in the second analog-to-digital converter 11, optionally after current-to-voltage conversion. The associated digital signal Ea" is fed to the evaluation circuit 6 via the second coupling element 13.

The second signal input 23 is connected with the test signal generator 7 via the third coupling element 14. A first amplifier and conversion device 26 may optionally be arranged between the third coupling element 14 and the second signal input 23. Provided that, within the switchover device 16, the second signal input 23 is connected with the signal output 24, the test signal T generated via the test signal generator 7 is thereby digitized in the second analog-to-digital converter 11, optionally after current-to-voltage conversion. In this case, the digital signal Ta" corresponding to the second coupling element 13 is fed via the second coupling element to the evaluation circuit 6.

The control input 25 is connected via the fourth coupling element 15 with the switching signal generator 8. The switching signal generator 8 generates the corresponding control signal S, via which it is determined whether the first or second signal input 22, 23 should be connected with the signal output 24.

The test signal T is thus not fed permanently to the second analog-to-digital converter 11 but rather only when, due to corresponding actuation of the switchover device 16 by the switching signal generator 8, the second signal input 23 is switched through to the signal output 24. This is only temporarily the case. There is thus constant alternation between switching through of the first signal input 22 to the signal output 24 and switching through of the second signal input 23 to the signal output 24. As a rule, the slice of time during which the second signal input 23 is switched through to the signal output 24 is considerably smaller than the slice of time during which the first signal input 22 is switched through to the signal output 24. This is of subordinate significance, however.

To evaluate the digital signals Ea', Ea" Ta", the evaluation circuit 6 generally has a first and a second filter device 27, 28. The two filter devices 27, 28 may, for example, be formed as low-pass filters. With the filter devices 27, 28, the evaluation circuit 6 determines respective filtered signals F', F" on the basis of the digital signals Ea', Ea", Ta". One of the filtered signals F', F" (preferably the filtered signal F') is transmitted via the bus system 2' to the central processing unit 2.

The evaluation circuit 6 additionally generally has a first comparator 29. The first comparator 29 is active when and while the second analog-to-digital converter 11 is outputting the digital signal Ea". The filtered signals F', F" are fed to the first comparator 29. The filtered signals F', F" are compared with one another in the first comparator 29. If there is an appreciable difference, then a corresponding alarm message A is transmitted via the bus system 2' to the central processing unit 2. Otherwise, the alarm message A is not output. Owing to the alarm message A being output only in the event of an appreciable difference, it is particularly possible to take into account slight differences in the digital signals Ea', Ea" that may arise as a result of component tolerances or different sampling times.

The evaluation circuit 6 additionally generally has a second comparator 30. The second comparator 30 is active when and while the second analog-to-digital converter 11 is outputting the digital signal Ta". The filtered signal F" and the test signal T are fed to the second comparator 30. The filtered signal F" and the test signal T are compared with one another in the second comparator 30. If there is an appreciable difference, a corresponding alarm message A' is transmitted via the bus system 2' to the central processing unit 2. Otherwise, the alarm message A' is not output.

In many cases, unidirectional or bidirectional transmission of digital signals from the control and evaluation device 5 to the sensor 19 and/or back also occurs via the input terminals 9a. This type of transmission is known to skilled persons by the acronym HART (Highway Addressable Remote Transducer). In the context of HART, a logical zero is encoded with a first frequency, for example, with 1.2 kHz, and a logical one with a second frequency, for example, 2.2 kHz (so-called FSK=frequency shift keying). The unidirectional or bidirectional transmission of digital signals from the control and evaluation device 5 to the sensor 19 and/or back, for example, enables configuration and/or monitoring of the sensor 19.

To bring about transmission from the sensor 19 to the control and evaluation device 5, the control and evaluation device 5 for the input channel 4a may have a receiver 31. The receiver 31 is in this case connected with the output side of the first or second coupling element 12, 13. The receiver 31 may filter the frequency-encoded receive signal out of the corresponding digital signal Ea', Ea" by suitable frequency filtering.

To bring about transmission from the control and evaluation device 5 to the sensor 19, the control and evaluation device 5 for the input channel 4a has a transmitter 32. The transmitter 32 is connected with the input terminals 9a via the above-mentioned fifth coupling element 20. The transmitter 32 thereby feeds a frequency-encoded transmit signal into the analog input signal Ea. Where necessary, a second amplifier and conversion device 33 may be arranged between the fifth coupling element 20 and the input terminals 9a.

The evaluation circuit 6, the test signal generator 7, the switching signal generator 8, the receiver 31 and the transmitter 32 are arranged within a dashed frame. The elements arranged within this frame are present in the control and evaluation device 5 individually for the respective input channel 4a to 4d. Likewise, the analog-to-digital converters 10, 11, the switchover device 16 and optionally the current-to-voltage converters 17, 18 and the amplifier and conversion devices 26, 33 are present individually for the respective input channel 4a to 4d. The same is true of the first to fourth coupling element 12 to 15 and optionally also the fifth coupling element 20.

As a rule, the module 3c additionally has a first power supply device 34. The first power supply device 34 supplies the control and evaluation device 5 with electrical energy. The first power supply device 34 is connected with a second power supply device 35 via the above-mentioned sixth coupling element 21. The second power supply device 35 is thus supplied via the sixth coupling element 21. The second power supply device 35 supplies the first and second analog-to-digital converters 10, 11 at least of the input channel 4a with electrical energy. Where necessary, the further elements of the respective input channel 9a are also supplied with electrical energy via the second power supply device 35. This relates in particular to the switchover device 16 and, where present, the current-to-voltage converters 17, 18 and the amplifier and conversion devices 26, 33.

As a rule, the second power supply device 35 also supplies the corresponding elements of the other input channels 4b to 4d. Respective supply of the individual input channels 4a to 4d may proceed separately and with electrical isolation from input channel 4a to 4d to input channel 4a to 4d.

Figure 4:
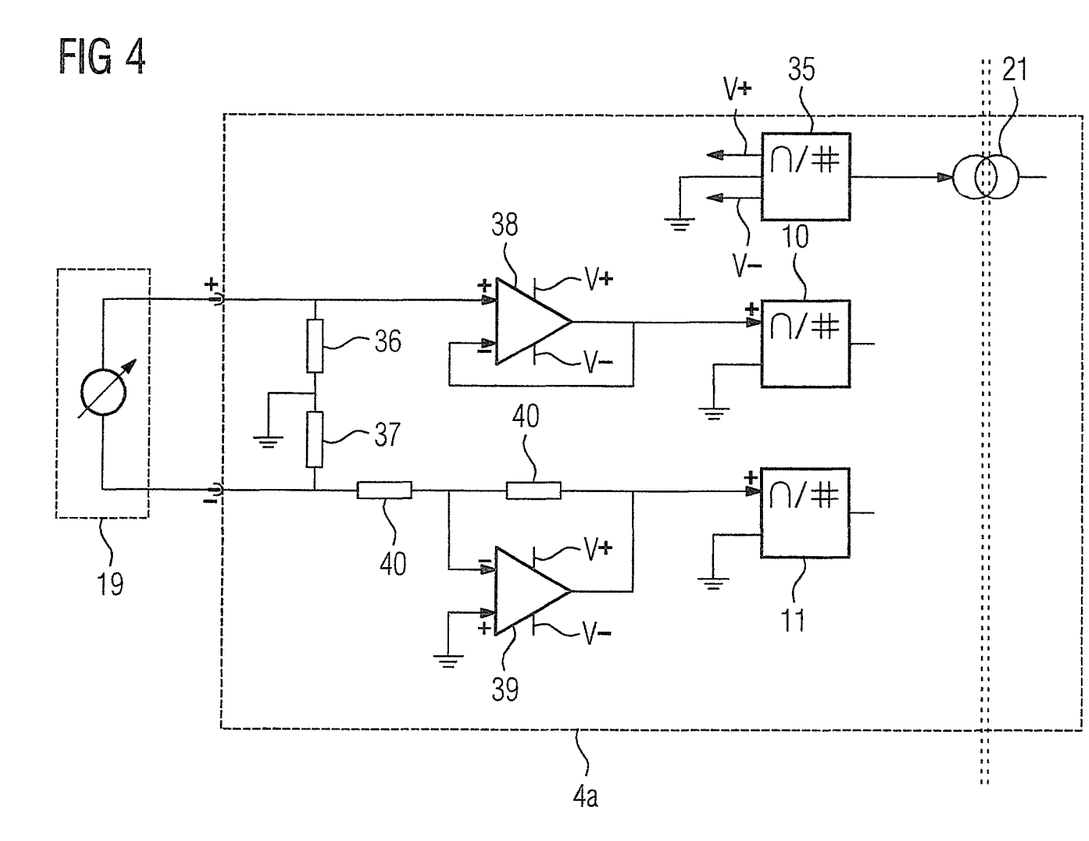
FIG. 4 shows a schematic representation of the analog side of an input channel in accordance with the invention.

FIG. 4 shows a possible embodiment of the analog side of the input channel 4a, where the switchover device 16 is not shown for purposes of clarity. Similar explanations again apply for the other input channels 4b to 4d.

In the context of the embodiment of FIG. 4, the input signal Ea is a current signal. As shown in FIG. 4, the second power supply device 35 provides a positive and a negative potential V+, V− and a reference potential (indicated by the ground symbol) for the input channel 4a. The two current-to-voltage converters 17, 18 are present and each consist of an input resistor 36, 37 and a downstream operational amplifier 38, 39. One of the two operational amplifiers 38, 39 is connected with snubber resistors 40. The snubber resistors 40 are preferably (but not necessarily) identical in size.

Figure 5:
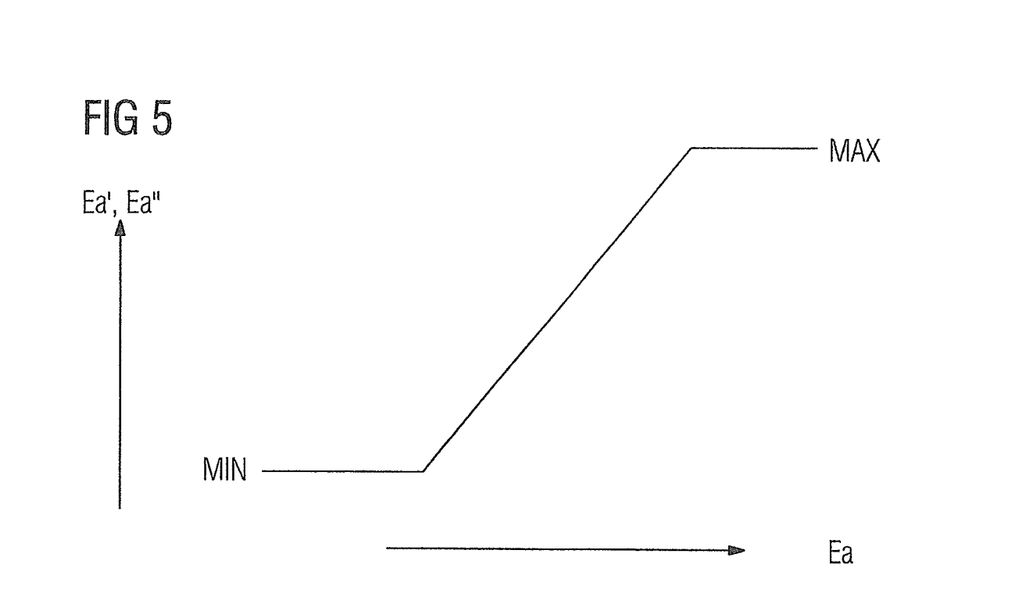
FIG. 5 shows a values diagram.

With reference to FIG. 5, the digital signal Ea' output by the first analog-to-digital converter 10 is proportional to the analog input signal Ea. The quantization of the digital signal Ea' arising in the context of digitization may be ignored in this context. The digital signal Ea', however, has an upper limit of a maximum value MAX and a lower limit of a minimum value MIN. The digital signal Ea' output by the first analog-to-digital converter 10 therefore always lies in the range of values defined by the minimum value MIN and the maximum value MAX. The possible range of values of the digital signal Ea' is therefore predetermined. With further reference to FIG. 5, similar explanations also apply for the digital signal Ea" output by the second analog-to-digital converter 11.

Figure 6:
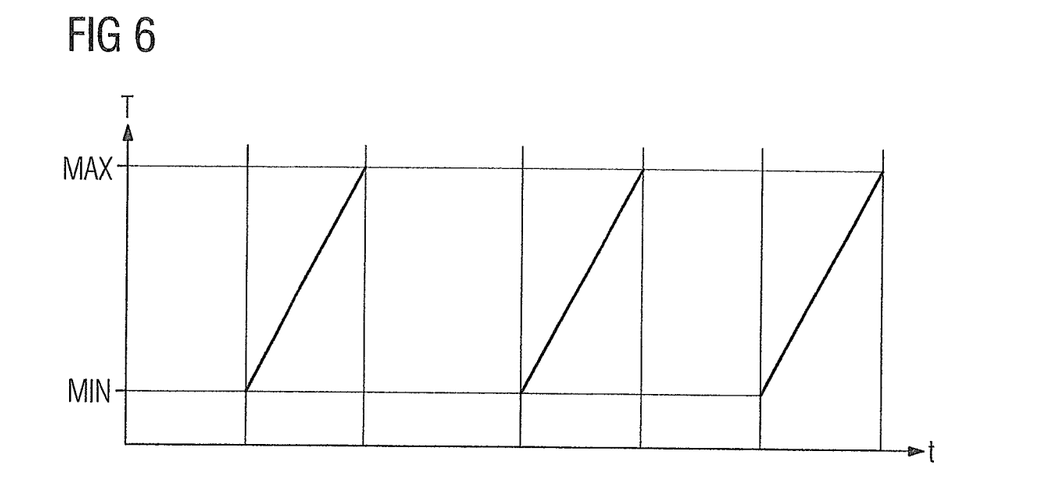
FIG. 6 shows a graphical plot of a time diagram.
Figure 7:
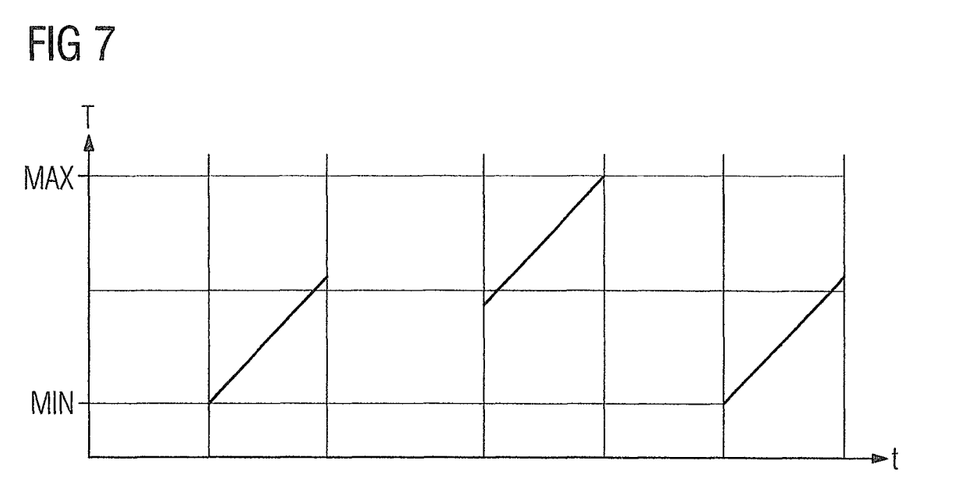
FIG. 7 shows a graphical plot of a further time diagram.

With reference to FIGS. 6 and 7, the test signal generator 7 is configured such that the test signal T runs cyclically through the full predetermined range of values as a function of the time t. In this way, the second analog-to-digital converter 11 is tested cyclically over its full admissible range of values.

It is possible for the test signal generator 7 and the switching signal generator 8 to be tuned to one another such that (after corresponding switching through of the second signal input 23 to the signal output 24) the test signal T is fed via the second signal input 23 to the second analog-to-digital converter 11, then the test signal T runs through the full predetermined range of values and only thereafter (therefore once the test signal T has run through the full predetermined range of values) is the analog input signal Ea again fed to the second analog-to-digital converter 11. This time sequence is shown in FIG. 6. The corresponding switchover times are indicated in FIG. 6 by vertical dashed lines.

It is alternatively possible for the test signal generator 7 and the switching signal generator 8 to be tuned to one another such that, according to the representation in FIG. 7, although the test signal T is initially fed to the second analog-to-digital converter 11 via the second signal input 23, the test signal T then, however, runs through just part of the full predetermined range of values. After running through this part of the predetermined range of values, the switchover device 16 is again switched over and the analog input signal Ea is thereby again fed to the second analog-to-digital converter 11.

Switching through of the test signal T and the analog input signal Ea proceeds alternately, as already mentioned. With subsequent re-switching through of the test signal T, the test signal T thus again only runs through part of the full predetermined range of values. As shown in FIG. 7, the part of the full predetermined range of values now run through is, however, a different part from the part run through previously. It is thus possible, on respective switching-through of the test signal T, gradually to run sequentially through the full predetermined range of values. Also in FIG. 7, as in FIG. 6, the corresponding switchover times are indicated by vertical dashed lines.

Figure 8:
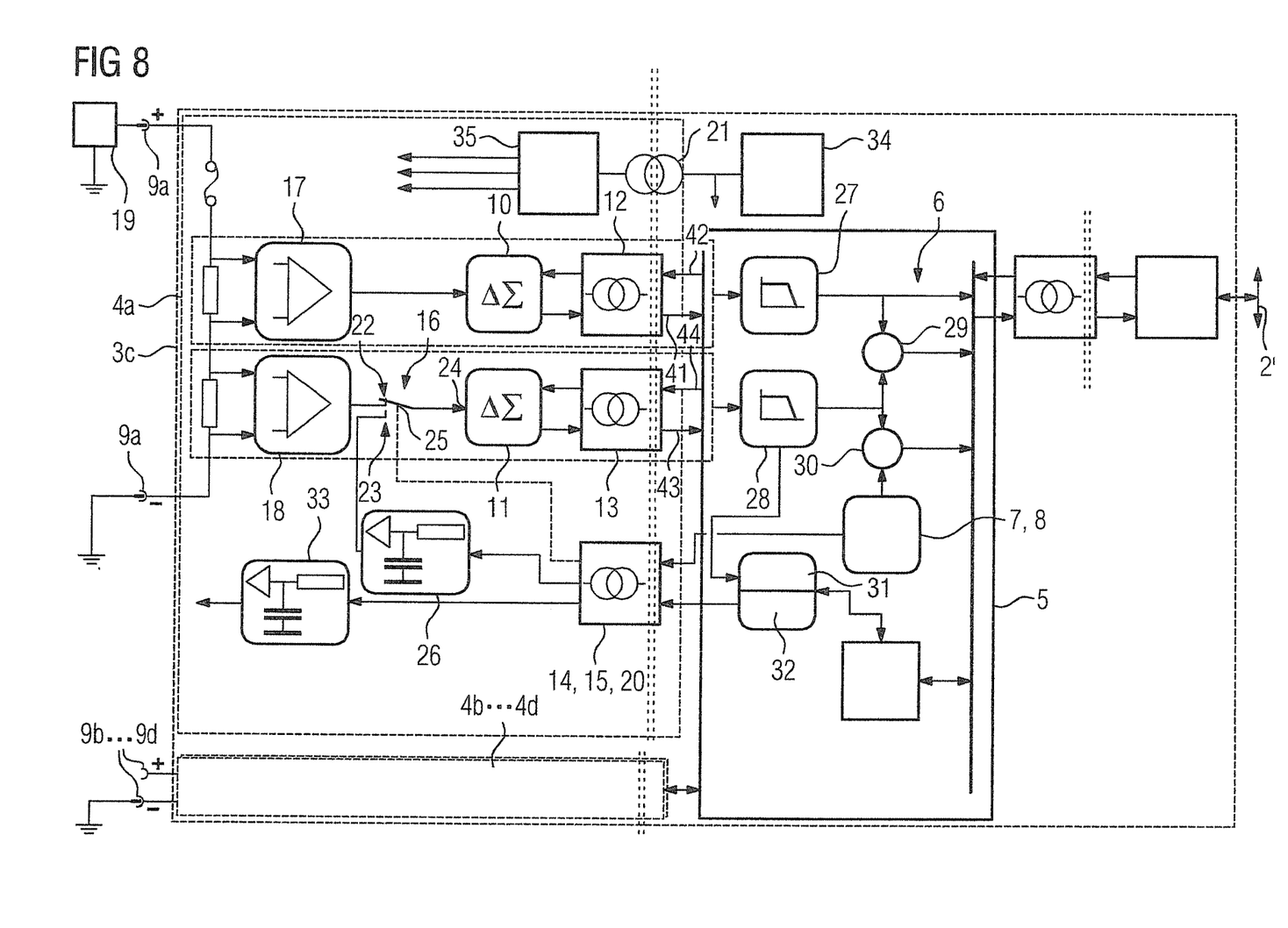
FIG. 8 shows one embodiment of the module of FIG. 3.

The analogue-to-digital converters 10, 11 can be configured as required. As shown in FIG. 8, it is possible, for example, for the respective first analog-to-digital converter 10 to be formed as a delta-sigma modulator. Delta-sigma modulation is familiar to a person skilled in the art. Reference may, for example, be made to the corresponding entries in the German- and English-language versions of Wikipedia.

In the case of delta-sigma modulation, the first coupling element 12 has a forward channel 41. The forward channel 41 serves to transmit the digital signal Ea'. Furthermore, the first coupling element 12 has a backward channel 42. The backward channel 42 serves to transmit a clock signal CLK from the evaluation circuit 6 to the first analog-to-digital converter 10.

The embodiments explained above in conjunction with the first analog-to-digital converter 10 and the first coupling element 12 may also be similarly achieved with the second analog-to-digital converter 11. In this case, the second coupling element 13 has not only a forward channel 43, but additionally also a backward channel 44.

The first and second analog-to-digital converters 10, 11 may be similarly formed. This is the case, for example, with the embodiment of FIG. 8. Alternatively, the first and second analog-to-digital converters 10, 11 may be diversely formed. A possible diverse embodiment is explained below in relation to FIG. 9.

Figure 9:
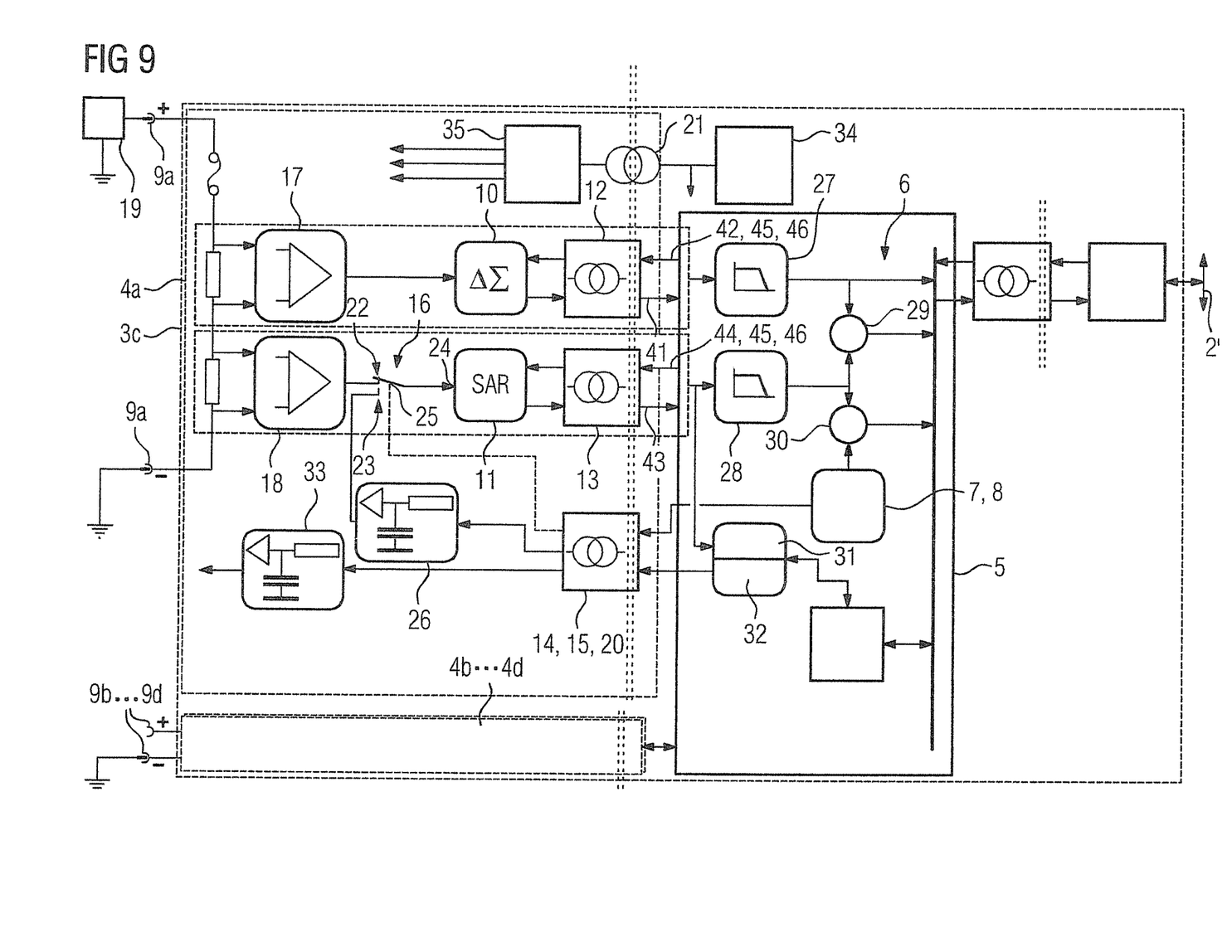
FIG. 9 shows a further embodiment of the module of FIG. 3.

In the embodiment of FIG. 9, one of the two analog-to-digital converters 10, 11 (here the first analog-to-digital converter 10) is formed as a delta-sigma modulator. The above explanations in relation to FIG. 8 about the embodiment of the first analog-to-digital converter 10 and the first coupling element 12 are likewise applicable.

The other one of the two analog-to-digital converters 10, 11 (here the second analog-to-digital converter 11) is differently formed. As shown in FIG. 9, for example, the second analog-to-digital converter 11 may be formed as an SAR analog-to-digital converter. The term "SAR" stands for Successive Approximation Register and has a fixed meaning for a person skilled in the art of analog-digital converters. Reference may, for example, be made to the entry entitled "Successive approximation ADC" in the English-language version of Wikipedia.

In the corresponding embodiment, the corresponding coupling element (here the coupling element 13) has the forward channel 43. The forward channel 43 serves to transmit the digital signal Ea". Furthermore, the second coupling element 13 has the backward channel 44. The backward channel 44 serves to transmit the clock signal CLK from the evaluation circuit 6 to the second analog-to-digital converter 11. Furthermore, the second coupling element 13 has two further backward channels 45, 46. These two backward channels 45, 46 serve to transmit a configuration signal CONFIG and a data frame signal FRAME from the evaluation circuit 6 to the second analog-to-digital converter 11.

Other embodiments of the analog-to-digital converters 10, 11 are also possible. If one of the two analog-to-digital converters 10, 11 is formed as a delta-sigma modulator, then the other one of the two analog-to-digital converters 10, 11 does not necessarily have to be formed as an SAR analog-to-digital converter. Likewise, in the event of one of the two analog-to-digital converters 10, 11 being configured as an SAR analog-to-digital converter, the other one of the two analog-to-digital converters 10, 11 does not necessarily have to be embodied as a delta-sigma modulator. What is crucial is merely that the two analog-to-digital converters 10, 11 are differently, i.e., diversely, formed.

Figure 10:
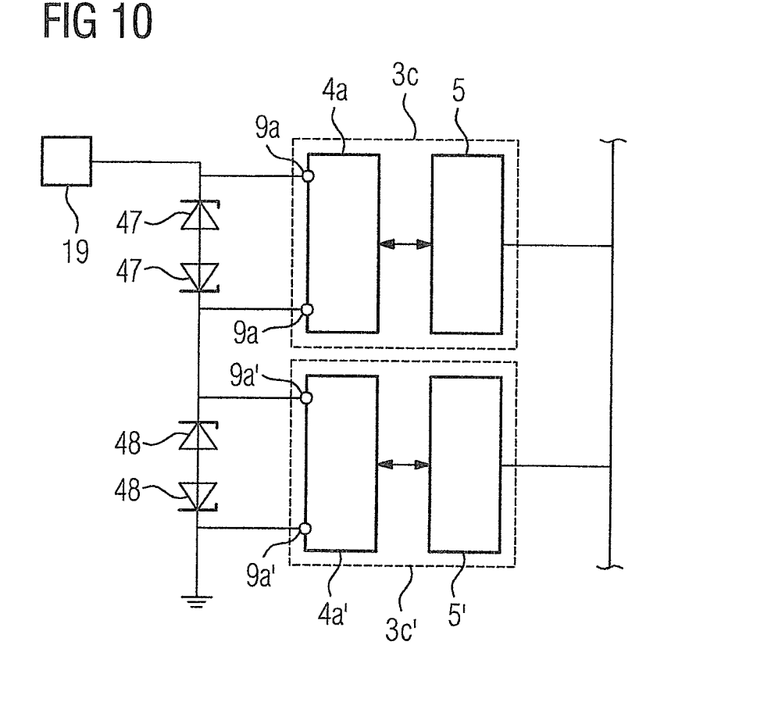
FIG. 10 shows a plurality of parallel-connected input channels in accordance with the invention.

With the previously described embodiments of the input channels 4a to 4d and of the control and evaluation device 5, it is straightforwardly possible to achieve safety levels SIL 1 and SIL 2 as defined in IEC standard 61508. In order to also achieve safety level SIL 3 as defined in IEC standard 61508, provision may be made, for example, in accordance with the representation in FIG. 10, to feed the same analog input signal to a plurality of input channels 4a to 4d. The analog input signal Ea may, for example, be fed both to the input channel 4a and also to an input channel 4a' of a further module 3c'. In order, in such a case, for example, because one of the modules 3c, 3c' is defective, to be able to change the modules 3c, 3c' individually, and nevertheless continue to receive the input signal Ea via the respective other module 3c', 3c, circuits with Zener diodes 47, 48 may be arranged on the input side of the input terminals 9a, 9a'. Here, in the event of removal, for example, of the module 3c, the analog input signal Ea output by the sensor 19 is guided via the circuit with the Zener diodes 47. If, on the other hand, the module 3c is present, then the analog input signal Ea output by the sensor 19 is guided via the input terminals 9a. The circuit with the Zener diodes 47 is in this case inactive. Similar explanations apply for the module 3c', the input channel 4a' thereof, the input terminals 9a' thereof and the associated circuit with the Zener diodes 48. The control and evaluation circuit of the module 3c' is denoted with reference sign 5'.

The procedure explained above in relation to FIG. 10 may be straightforwardly also extended to embodiments with more than two input channels 4a, 4a'.

To summarize, the present invention thus relates to the following substantive matter:

A module 3c of a programmable controller has a plurality of analog input channels 4a to 4d for, in each case, one analog input signal Ea to Ed, a control and evaluation device 5, and input terminals 9a to 9d for each input channel 4a to 4d for supplying the respective input signal Ea to Ed. For each input channel 4a to 4d, the module 3c has two analog-to-digital converters 10, 11, at least four coupling elements 12 to 15 and a switchover device 16. For each input channel 4a to 4d, the control and evaluation device 5 has an evaluation circuit 6, a test signal generator 7 and a switching signal generator 8. An input side of the one analog-to-digital converter 10 is directly or indirectly connected with the input terminals 9a to 9d, and an output side of this analog-to-digital converter 10 is connected with the evaluation circuit 6 via a coupling element 12. The switchover device 16 has two signal inputs 22, 23, a signal output 24 and a control input 25. One signal input 22 is directly or indirectly connected with the input terminals 9a to 9d, and the other signal input 23 is connected with the test signal generator 7 via a further coupling element 14. The control input 25 is connected with the switching signal generator 8 via a further coupling element 15. The signal output 24 is connected with an input side of the other analog-to-digital converter 11. An output side of the other analog-to-digital converter 11 is connected with the evaluation circuit 6 via a further coupling element 13. The coupling elements 12 to 15 each bring about or cause electrical isolation.

The present invention has many advantages. In particular, simple, inexpensive and reliable implementation of the module 3c is possible. Furthermore, despite the repeatedly occurring switching-through of the test signal T via the respective first analog-to-digital converter 10, permanent acquisition of the analog input signal Ea to Ed is possible. The two different alarm messages A, A' may, moreover, indicate which of the two analog-to-digital converters 10, 11 may be defective. Implementation of HART communication is straightforwardly possible. The input channels 4a to 4d may be fully electrically isolated from one another and from the control and evaluation device 5.

Although the invention has been illustrated and described in detail with reference to the preferred exemplary embodiment, the invention is not restricted by the disclosed examples and other variations may be derived therefrom by a person skilled in the art without going beyond the scope of protection of the invention.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A module of a programmable controller, comprising:
   a plurality of analog input channels for respective analog input signals;
   a control and evaluation device and for each input channel, independently of each other input channels of the plurality of input channels, input terminals for supplying each respective analog input signals;
   a first and a second analog-to-digital converter, a first, a second, a third and a fourth coupling element and a switchover device for each input channel of the plurality of input channels independently of each of the other input channels of the plurality of input channels;
   wherein the control and evaluation device includes for each input channel, independently of each input channel of the other plurality of input channels, an evaluation circuit, a test signal generator and a switching signal generator;
   wherein an input side of the respective first analog-to-digital converter is connected directly or indirectly with the respective input terminals and an output side of the respective first analog-to-digital converter is connected via the respective first coupling element with the respective evaluation circuit;
   wherein each respective switchover device includes a first and a second signal input, a signal output and a control input;
   wherein the first signal input of the respective switchover device is connected directly or indirectly with the respective input terminals, the second signal input of the respective switchover device is connected via the respective third coupling element with the respective test signal generator, the control input of the respective switchover device is connected via the respective fourth coupling element with the respective switching signal generator and the signal output of the respective switchover device is connected with an input side of the respective second analog-to-digital converter;

wherein an output side of the respective second analog-to-digital converter is connected via the respective second coupling element with the respective evaluation circuit; and wherein the respective first, the respective second, the respective third and the respective fourth coupling elements each comprise a coupling element which causes electrical isolation.

2. The module as claimed in claim 1, wherein the control and evaluation device is arranged in a field programmable gate array (FPGA).

3. The module as claimed in claim 2, wherein the control and evaluation device includes a respective receiver for each respective input channel of the plurality of input channels, said receiver being connected with an output side of a respective first or a respective second coupling element and filtering a respective frequency-encoded receive signal from a digital signal transmitted via the respective first or second coupling elements.

4. The module as claimed in claim 2, wherein the control and evaluation device includes a respective transmitter for the respective input channel;

wherein the respective transmitter is connected via a respective fifth coupling element with the respective input terminals, wherein the respective transmitter feeds a respective frequency-encoded transmit signal into the respective input signal; and wherein the respective fifth coupling element is formed as a coupling element causes electrical isolation.

5. The module as claimed in claim 1, wherein the control and evaluation device includes a respective receiver for each respective input channel of the plurality of input channels, said receiver being connected with an output side of a respective first or a respective second coupling element and filtering a respective frequency-encoded receive signal from a digital signal transmitted via the respective first or second coupling elements.

6. The module as claimed in claim 5, wherein the control and evaluation device includes a respective transmitter for the respective input channel;

wherein the respective transmitter is connected via a respective fifth coupling element with the respective input terminals;

wherein the respective transmitter feeds a respective frequency-encoded transmit signal into the respective input signal; and wherein the respective fifth coupling element is formed as a coupling element causes electrical isolation.

7. The module as claimed in claim 1, wherein the control and evaluation device includes a respective transmitter for the respective input channel;

wherein the respective transmitter is connected via a respective fifth coupling element with the respective input terminals;

wherein the respective transmitter feeds a respective frequency-encoded transmit signal into the respective input signal; and wherein the respective fifth coupling element is formed as a coupling element causes electrical isolation.

8. The module as claimed in claim 1, wherein the module includes a first power supply device which supplies the control and evaluation device with electrical energy;

wherein the first power supply device is connected with a second power supply device via a sixth coupling element;

wherein the second power supply device supplies the first and second analog-to-digital converters of at least one input channel of the plurality of input channels with electrical energy; and wherein the sixth coupling element is embodied as a coupling element which causes electrical isolation.

9. The module as claimed in claim 1, wherein the respective evaluation circuit includes:

a respective first and a respective second filter device for determining a respective first and a respective second filtered signal based on a respective digital signal output by the respective first and second analog-to-digital converters;

a respective first comparator for comparing the respective first and second filtered signals; and a respective second comparator for comparing a respective test signal output by the respective test signal generator and the respective second filtered signal.

10. The module as claimed in claim 1, wherein a respective digital signal respectively output by first and second analog-to-digital converters lies within a respective predetermined range of values; and wherein the respective test signal generator is configured such that a respective test signal output by a respective test signal generator runs cyclically through a respective full predetermined range of values.

11. The module as claimed in claim 10, wherein the respective test signal generator and the respective switching signal generator are tuned to one another such that the respective test signal is initially fed via the respective second signal input of the respective switchover device directly or indirectly to the respective second analog-to-digital converter, the respective test signal then runs through the respective full predetermined range of values, and such that only thereafter is the respective analog input signal again fed directly or indirectly to the respective second analog-to-digital converter.

12. The module as claimed in claim 10, wherein the respective test signal generator and the respective switching signal generator are tuned to one another such that:

a) the respective test signal is initially fed via the respective second signal input of the respective switchover device directly or indirectly to the respective second analog-to-digital converter, b) the respective test signal subsequently runs in each case through part of the respective full predetermined range of values, c) the respective analog input signal is thereafter again fed directly or indirectly to the respective second analog-to-digital converter, and d) steps a) to c) are performed repeatedly and when step b) is respectively performed the respective test signal in each case runs through a different part of the respective full predetermined range of values, until the respective test signal has, as a result of repeating step b), run through the respective full predetermined range of values.

13. The module as claimed in claim 1, wherein at least one of:

(i) the respective first analog-to-digital converter comprises a delta-sigma modulator and the respective first coupling element has not only a forward channel for transmitting a respective digital signal output by the respective first analog-to-digital converter but also a backward channel for transmitting a respective clock signal from the respective evaluation circuit to the respective first analog-to-digital converter and (ii) the respective second analog-to-digital converter comprises a delta-sigma modulator and the respective second coupling element has not only a forward channel for transmitting a respective digital signal output by the respective second analog-to-digital converter but also a backward channel for transmitting a respective clock signal from the respective evaluation circuit to the respective second analog-to-digital converter.

14. The module as claimed in claim 1, wherein the respective first second analog-to-digital converters are diversely configured.

15. The module as claimed in claim 14, wherein based on the respective first and second analog-to-digital converters, at least one of:
(i) one analog-to-digital converter of the respective first and second analog-to-digital converters comprises a delta-sigma modulator and the coupling element connected with this analog-to-digital converter has not only a forward channel for transmitting a digital signal output by this analog-to-digital converter but also a backward channel for transmitting a clock signal from the respective evaluation circuit to this analog-to-digital converter and
(ii) another analog-to-digital converter of the respective first and second analog-to-digital converters comprises an Successive Approximation Register (SAR) analog-to-digital converter and the coupling element connected with this analog-to-digital converter has not only a forward channel for transmitting a digital signal output by this analog-to-digital converter but also three backward channels for transmitting a clock signal (CLK), a configuration signal (CONFIG) and a data frame signal (FRAME) from the respective evaluation circuit to this analog-to-digital converter.

16. The module as claimed in claim 1, wherein the respective first, the respective second, the respective third and the respective fourth coupling elements comprise inductive couplers.

\* \* \* \* \*